(12) United States Patent
Wang et al.

(10) Patent No.: US 10,466,877 B2
(45) Date of Patent: Nov. 5, 2019

(54) METHOD AND DEVICE FOR SELECTING ENTITY IN DRAWING

(71) Applicant: Suzhou Gstarsoft Co., Ltd., Suzhou, Jiangsu (CN)

(72) Inventors: Guangsheng Wang, Jiangsu (CN); Songbin Guan, Jiangsu (CN); Changchun Li, Jiangsu (CN); Jiang Liang, Jiangsu (CN); Xiang Lu, Jiangsu (CN)

(73) Assignee: SUZHOU GSTARSOFT CO., LTD., Suzhou, Jiangsu (CN)

( * ) Notice: Subject to any disclaimer, the term of this patent is extended or adjusted under 35 U.S.C. 154(b) by 551 days.

(21) Appl. No.: 14/917,252

(22) PCT Filed: Sep. 30, 2014

(86) PCT No.: PCT/CN2014/088052
§ 371 (c)(1),
(2) Date: Mar. 7, 2016

(87) PCT Pub. No.: WO2015/055087
PCT Pub. Date: Apr. 23, 2015

(65) Prior Publication Data
US 2016/0224215 A1 Aug. 4, 2016

(30) Foreign Application Priority Data
Oct. 18, 2013 (CN) .......................... 2013 1 0495518

(51) Int. Cl.
*G06F 3/048* (2013.01)
*G06F 3/0484* (2013.01)
(Continued)

(52) U.S. Cl.
CPC ........ *G06F 3/04842* (2013.01); *G06F 3/0481* (2013.01); *G06F 3/0484* (2013.01);
(Continued)

(58) Field of Classification Search
None
See application file for complete search history.

(56) References Cited

U.S. PATENT DOCUMENTS 5,835,090 A * 11/1998 Clark ....................... G09G 5/14
715/764
6,075,531 A * 6/2000 DeStefano ............ G06F 3/0481
715/788
(Continued)

FOREIGN PATENT DOCUMENTS

CN 101561830 A 10/2009
CN 102799720 A 11/2012
(Continued)

OTHER PUBLICATIONS

International Search Report in PCT/CN2014/088052 dated Jan. 5, 2015 in 4 pages.

*Primary Examiner* — Shih-Wei Kraft
(74) *Attorney, Agent, or Firm* — Knobbe, Martens, Olson & Bear, LLP

(57) ABSTRACT

The present invention discloses a method and a device for selecting an entity in a drawing, wherein the method includes that a hooked preview program corresponding to a functional instruction is invoked after the functional instruction is inputted into a Computer Aided Design (CAD) system; a pickup point in a drawing is selected; an entity in a predetermined range is filtered around the pickup point to obtain a preselected entity; the preselected entity is processed via the hooked preview program so as to pre-display a result of processing the preselected entity by the inputted instruction. An effect of a selected entity processed by a control instruction can be previewed according to the present invention, thus avoiding repeated selections of a graphic entity by a user to further improve working efficiency.

17 Claims, 6 Drawing Sheets

(51) Int. Cl.
  *G06F 17/50* (2006.01)
  *G06F 3/0481* (2013.01)
  *G06T 3/40* (2006.01)

(52) U.S. Cl.
  CPC .......... *G06F 3/04845* (2013.01); *G06F 17/50* (2013.01); *G06T 3/40* (2013.01)

(56) References Cited

U.S. PATENT DOCUMENTS

| | | | | |
|---|---|---|---|---|
| 2003/0060913 | A1* | 3/2003 | Turner | G06F 17/5095 700/103 |
| 2006/0150148 | A1* | 7/2006 | Beckett | G06F 9/541 717/109 |
| 2007/0240049 | A1 | 10/2007 | Rogerson et al. | |
| 2010/0110095 | A1* | 5/2010 | Sekiguchi | G09G 5/005 345/589 |
| 2010/0205575 | A1* | 8/2010 | Arora | G06F 3/04812 716/122 |
| 2011/0112803 | A1* | 5/2011 | Diguet | G06F 17/50 703/1 |

FOREIGN PATENT DOCUMENTS

| | | | |
|---|---|---|---|
| CN | 103123718 | A | 5/2013 |
| CN | 103530021 | A | 1/2014 |
| WO | 0142995 | A2 | 6/2001 |

* cited by examiner

METHOD AND DEVICE FOR SELECTING ENTITY IN DRAWING

CROSS REFERENCE TO RELATED APPLICATIONS

This application is the U.S. National Phase Application under 35 U.S.C. § 371 of International Application No. PCT/CN2014/088052, filed Sep. 30, 2014, which claims the benefit of Chinese Patent Application No. 201310495518.2, filed Oct. 18, 2013, which are hereby incorporated by reference in their entirety.

TECHNICAL FIELD

The present invention relates to the field of graphic processing, and more particularly to a method and a device for selecting an entity in a drawing.

BACKGROUND

With continuous development of information technologies, software of a Computer Aided Design (CAD) graphic system has become an indispensable drawing tool of drawing personnel or designers. The capacities of storage devices are increased due to the improvement of the level of science and technology, and a designer usually draws many entities in a CAD drawing. Such a huge and dense set of entities has brought a big problem for a CAD system operator to select a single entity or some entities. The intensity of entities reduces the probability for a user to select a target entity. Such a problem is prominent especially on a mobile device. Since a screen of a common mobile device is relatively small, the pad of a finger seems relatively large when compared with the screen, it is less accurate and more difficult for the finger to select a target entity on a CAD finger system of the device.

Generally, an entity of a CAD figure can be processed by a control instruction in a CAD system. The control instruction can include a TRIM command (an entity trimming command), an offset command (an entity deleting command), a chamfer command (an entity copying command), a Mirror command (an entity mirroring command) and an Array command (an entity arraying command) and so on, and a processing flow of an existing control instruction includes several steps as follows.

First, a command function corresponding to the control instruction is invoked after the control instruction is inputted on a CAD platform.

Secondly, a user is prompted to select an entity, and the user selects a pickup point as required.

Thirdly, a system filters an entity according to a predetermined range of the pickup point, and uses an entity obtained through the filtering as a selected entity.

Finally, the control instruction performs corresponding processing to the selected entity, e.g. a TRIM command will trim the entity, an offset command will delete the entity from a drawing and so on.

It may be learned from the analysis above that all existing selecting methods and systems of a CAD graphic system use an entity selecting technology that a point where a finger leaves on a screen of a mobile device is used as a pickup point and an entity where the pickup point locates is determined and then used as a finally-selected entity. However, such selecting devices have many disadvantages. On one hand, existing screens of mobile devices are mostly capacitive screens and a point where a finger lifts to leave such screens deviates from a desired pickup point of a user, thus an entity obtained finally may not be expected by the user. On the other hand, most screens of mobile devices are touch screens, which are very inconvenient for selecting an entity with a finger. The pad of a finger, which occupies a large area on a screen, shields the user from observing an entity on the screen, thus it is difficult to select the entity, or a desirable entity can be hardly selected.

In addition, during existing methods for selecting an entity, an entity is not preselected in a selection process and the result of preselecting an entity is not displayed to a user, thus resulting a large finger coverage, and the user cannot be prompted that an entity will be selected when there are a plurality of entities in a finger selection area, thereby the user may select a wrong entity.

In addition, during a process of selecting an entity on a CAD platform of various devices, a user is incapable of foreseeing the final effect of a preselected entity processed by a control instruction, thus the user can learn whether a selected entity is satisfactory only after the selected entity is processed through the control instruction. If the selected entity is unsatisfactory, a wrong selection is proven and the user has to further execute a backspace command on the CAD platform to recover the entity to a state before the entity is processed by a command and reselect an entity, thus causing repeated selections to result in a lot of unnecessary work invisibly, which reduces working efficiency.

At present, there is no effective solution for a problem in the prior art that a processing process of a control instruction needs to be performed repeatedly and working efficiency is reduced because a user needs to recover a graphic entity to a state before processing when a processing result, which can be learned by the user only after the control instruction is executed during a process of processing the graphic entity with the control instruction of a graphic system, is unsatisfactory.

SUMMARY

At present, there is no effective solution for the problem in the prior art that a processing process of a control instruction needs to be performed repeatedly and working efficiency is reduced because a user needs to recover a graphic entity to a state before processing when a processing result, which can be learned by the user only after the control instruction is executed during a process of processing the graphic entity with the control instruction of a graphic system, is unsatisfactory. Thus, a major purpose of the present invention is to provide a method and a device for selecting an entity in a drawing to solve the problem above.

To achieve the purpose above, a method for selecting an entity in a drawing is provided according to an aspect of the present invention. The method includes that a hooked preview program corresponding to a functional instruction is invoked after the functional instruction is inputted into a CAD system; a pickup point in a drawing is selected; an entity in a predetermined range is filtered around the pickup point to obtain a preselected entity; the preselected entity is processed via the hooked preview program so as to pre-display a result of processing the preselected entity by the inputted instruction.

To achieve the purpose, a device for selecting an entity in a drawing is provided according to another aspect of the present invention. The device includes: an invoking module, configured to invoke a hooked preview program corresponding to a functional instruction after the functional instruction is inputted into a CAD system; a selecting module, configured to select a pickup point in a drawing; a filtering module, configured to filter an entity in a predetermined range around the pickup point to obtain a preselected entity; a processing module, configured to process the preselected entity via the hooked preview program so as to pre-display a result of processing the preselected entity by the inputted instruction.

By means of the present invention, a hooked preview program corresponding to a functional instruction is invoked after the functional instruction is inputted into a CAD system; a pickup point in a drawing is selected; an entity in a predetermined range is filtered around the pickup point to obtain a preselected entity; the preselected entity is processed via the hooked preview program so as to pre-display a result of processing the preselected entity by the inputted instruction, thus solving the problem in the prior art that a processing process of a control instruction needs to be performed repeatedly and working efficiency is reduced because a user needs to recover a graphic entity to a state before processing when a processing result, which can be learned by the user only after the control instruction is executed during a process of processing the graphic entity with the control instruction of a graphic system, is unsatisfactory, and further implementing preview of an effect of a selected entity processed by a control instruction, thus avoiding repeated selections of a graphic entity by the user to further improve working efficiency.

BRIEF DESCRIPTION OF THE DRAWINGS

The accompanying drawings illustrated herein are used for providing further understanding to the present invention and constitute a part of the present application. The exemplary embodiments of the present invention and the illustration thereof are used for explaining the present invention instead of constituting an improper limitation to the present invention. In the accompanying drawings.

DETAILED DESCRIPTION

Figure 1:
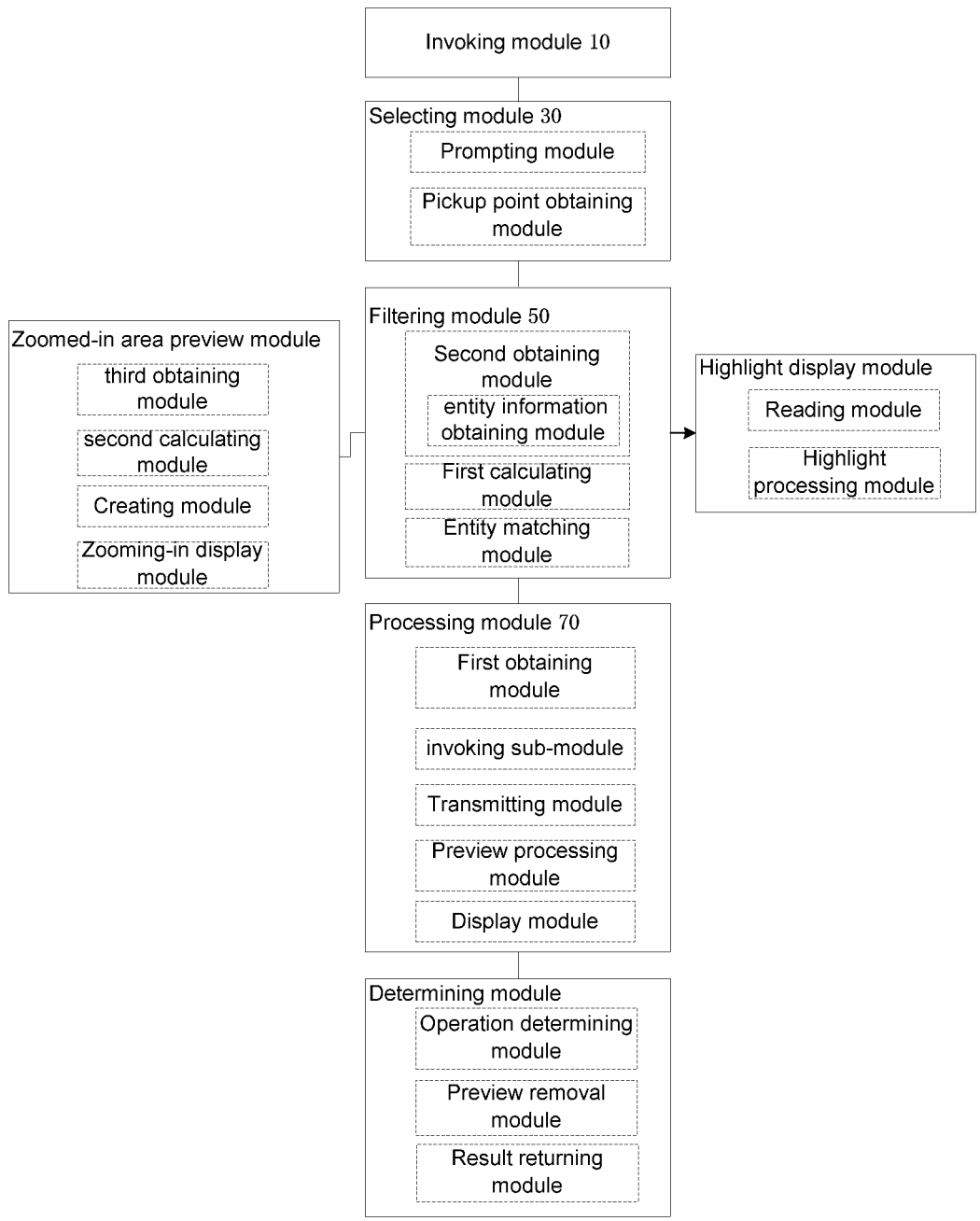
FIG. 1 is a structural diagram of a device for selecting an entity in a drawing according to an embodiment of the present invention.

It needs to be noted that the embodiments in the present application and the characteristics in the embodiments may be combined with each other if there is no conflict. The present invention will be expounded below with reference to the accompanying drawings and in conjunction with the embodiments.

Before describing further details of the embodiments of the present invention, an appropriate computing architecture that may be applied to implementing the principles of the present invention will be described with reference to FIG. 1. Unless indicated otherwise, the embodiments of the present invention will be described in the following description with reference to symbolic representations of actions and operations performed by one or more computers. As such, it may be understood that such actions and operations, which are at times referred to as being computer-executed, include manipulation by a processing unit of a computer for electrical signals representing data in a structured form. This manipulation transforms the data or maintains them at locations in a memory system of the computer, which reconfigures or alters operations of the computer in a manner understood by those skilled in the art. Data structures for maintaining data are physical locations of a memory having specific properties defined by a format of the data. However, while the present invention has been described in the foregoing context, it is not meant to be restrictive as those of skill in the art will appreciate that all aspects of actions and operations described hereinafter may be also implemented by hardware.

Turning to the accompanying drawings, identical reference numerals therein refer to identical elements. The principles of the present invention are illustrated as being implemented in a suitable computing environment. The following description is based on the embodiments of the present invention and should not be taken as limiting the present invention with regard to alternative embodiments that are not explicitly described herein.

The principles of the present application are operational with other general-purpose or special-purpose computing or communications environments or configurations. Examples of well-known computing systems, environments, and configurations applicable to the application include, but are not limited to, Personal Computers (PC), servers, multiprocessor systems, systems based on micro-processing, minicomputers, mainframe computers, and distributed computing environments that include any of the above systems or devices.

Embodiment 1

FIG. 1 is a structural diagram of a device for selecting an entity in a drawing in its most basic configuration according to an embodiment of the present invention. As shown in FIG. 1, the device for selecting an entity in a drawing can include: an invoking module 10, a selecting module 30, a filtering module 50 and a processing module 70.

Wherein the invoking module 10 is configured to invoke a hooked preview program corresponding to a functional instruction after the functional instruction is inputted into a CAD system.

The selecting module 30 is configured to select a pickup point in a drawing. Specifically, the selecting module 30 can be configured to select a pickup point in a CAD graphic system.

The filtering module 50 is configured to filter an entity in a predetermined range around the pickup point to obtain a preselected entity. Specifically, the filtering module 50 can filter an entity in a certain area range, which takes the pickup point as the center, as a preselected entity. The area range can be adjusted according to the size of a current display screen, e.g. a relatively large area can be preset on a display screen of a mobile phone while a relatively small display area can be preset on a display screen of a computer according to an actual condition.

The processing module 70 is configured to process the preselected entity via the hooked preview program so as to pre-display the preselected entity processed by the inputted instruction.

After the functional instruction is input into the CAD system, the invoking module 10 in the embodiment of the present application starts to invoke the preview program hooked on the functional instruction, and after the selecting module 30 and the filtering module 50 implement the filtering processing based on the selected pickup point in a graphic system (e.g. the CAD graphic system) so as to obtain the preselected entity, the preselected entity is processed by the hooked preview program so as to preview the effect of the selected entity processed by the CAD functional instruction, thus solving the problem in the prior art that the processing process of a control instruction needs to be performed repeatedly and working efficiency is reduced because a user needs to recover a graphic entity to a state before processing when a processing result, which can be learned by the user only after the control instruction is executed during the process of processing the graphic entity with the control instruction of a graphic system, is unsatisfactory, and further implementing preview of the effect of a selected entity processed by a control instruction, thus avoiding repeated selections of a graphic entity by the user to further improve working efficiency.

Specifically, it may be implemented through the solution above that a user does not need to "process a selected entity through a control command" before knowing whether a processing result of the selected entity is satisfactory. If the processing result is unsatisfactory, the user does not need to execute a backspace command on the CAD system to recover the entity to a state before the entity is processed by the command. The preselected entity can be processed through the preview program, and the effect of the processed preselected entity is displayed on the drawing, thus avoiding a lot of unnecessary work to further address a blind spot that a processing result cannot be foreseen during "the process of selecting an entity" and improving the accuracy for a user to select an entity. During a selection process, if a processing effect previewed by a user is unsatisfactory, a mouse or a finger can be moved to reselect a pickup point to obtain a new preselected entity, thus avoiding an unnecessary fallback operation after a current wrong selection.

The processing module 70 in the embodiment of the present application can include: a first obtaining module, configured to obtain entity information of the preselected entity and coordinate values of the pickup point; an invoking sub-module, configured to invoke a callback function in the preview program hooked to a control instruction, specifically, the callback function can be Preview (Entity*ent, Point pt); a transmitting module, configured to transmit, by the callback function, the entity information and the coordinate values as parameters into a preview processing function, specifically, the entity information and the coordinate values of the pickup point can be transmitted into Preview (Entity*ent, Point pt) as parameters; a preview processing module, configured to perform, by the preview processing function, preview processing to the preselected entity to obtain a preview processing result; a display module, configured to return the preview processing result to the callback function in the preview program and display the preview processing result, so as to display the entity information returned by the function, i.e. effect data of the processed preselected entity, in a current drawing, wherein the preview processing result is the same with a result of processing the preselected entity by the control instruction to which the preview program is hooked. The embodiment provides an interface to invoke the preview processing function by the callback function in the preview program, thus it is implemented that a processing effect is previewed before the preselected entity is processed by the control instruction.

In an example embodiment, the processing device can further include: a first determining module, configured to determine whether to select the preview processing result; specifically, it can be determined to select the preview processing result by determining whether a user inputs a selection acknowledgement instruction; a returning module, configured to return, if it is determined to select the preview processing result, the entity information of the preselected entity to the control instruction to which the preview program is hooked, to enable the control instruction to process the preselected entity; a recovering module, configured to recover, if it is determined not to select the preview processing result, the preselected entity to a state before it is processed by the preview program, during this process, a background needs to delete the preview processing result first, and then store the state of the preselected entity not processed by the preview program.

Specifically, it is implemented by the embodiment above that whether the user acknowledges a selection is determined, if yes, the entity is recovered to a state before it is processed by the function and then information of the preselected entity is returned to a command of an upper layer. If no, effect data displayed in a current drawing is deleted and original data information of the preselected entity is displayed in the drawing, then a new preselected entity is obtained, and the hooked preview program is invoked again to process the new preselected entity.

In the embodiment above of the present application, the filtering module 50 can include: a second obtaining module, a first calculating module and an entity matching module. Wherein, the second obtaining module is configured to obtain coordinate values of all entities in the drawing. Specifically, the second obtaining module provides an entity information obtaining module which can be configured to obtain data of all entities in the drawing, e.g. coordinate values of the entities.

The first calculating module is configured to calculate an area coverage, which takes the pickup point as a center, according to a predetermined range threshold to obtain the predetermined range.

The entity matching module is configured to match the coordinate values of all entities with the coordinate values of the pickup point, and match the coordinate values of all entities with coordinate values of points within the pickup point in the predetermined range to filter and obtain the preselected entity, wherein the preselected entity is a set of entities having completely identical or partially identical coordinate values as those of the pickup point and the points within the predetermined range around pickup point. Specifically, it is implemented by the module that the preselected entity is determined by matching coordinate data of all entities with coordinate data of an entity in the predetermined range. The predetermined range is defined by coordinate values of the current pickup point and coordinate values in the area range. Since the predetermined range may not cover all entities, the range of the preselected entity may be the same as the predetermined range, or may be overlapped much with the predetermined range. Therefore, coordinates of all entity points which constitute the preselected entity may be all in the predetermined range, or may be partly in the predetermined range. Apparently, coordinate values of the overlapped entities can be a range value, e.g. a range of overlapped entities on a display device may be larger than or equal to 1 pixel, and may be preferably 10 pixels, and a range of overlapped entities on a PC may also be larger than or equal to 1 pixel, and may be preferably 5 pixels.

Wherein if no entity is matched in the area range of the pickup point, it is indicated that no entity is selected this time, and then a null value is returned to a subsequent processing module.

In the embodiments of the present application, the device can further include a zoomed-in area preview module. The module can include: a third obtaining module, a second calculating module, a creating module and a zooming-in display module. Wherein the third obtaining module is configured to obtain a predetermined zooming-in factor.

The second calculating module is configured to perform calculation according to the predetermined zooming-in factor and pixels of a display screen to obtain the size of a zoomed-in display area. Specifically, the module implements a function of calculating a zooming-in size, which enables the size of a zoomed-in area to be calculated according to the size of a screen and a zooming-in factor. For example, the size of the zoomed-in area can be equal to the screen size multiplied by a proportionality coefficient t (the variable t can be a value set by the user, but the value cannot be larger than 1, thus ensuring that the size of the display area is always smaller than the size of the screen), and the size of a content displayed in the zoomed-in area is equal to multiplying pixels where the pickup point locates by the predetermined zooming-in factor.

The creating module is configured to create the zoomed-in display area at a predetermined position on the display screen. Specifically, the module provides a function of creating a zoomed-in area, i.e. the zoomed-in area is created and displayed according to the pickup point and the size of a screen on an appropriate position which cannot be shielded by a finger.

The zooming-in display module is configured to display, in the zoomed-in display area, the preselected entity or the preselected entity processed by the hooked preview program. Specifically, it is implemented by the module that a result obtained after a zooming-in display processing is previewed to preview the effect of a selected entity processed by a command.

Specifically, the embodiment above can be applied to display, in a zooming-in manner, the area for selecting an entity which is shielded by a finger pad, i.e. a function of previewing a preselected entity in a zoomed-in area is provided to generate a zoomed-in area in an appropriate position on a screen, display the area shielded by a finger pad in the zoomed-in area in a zooming-in manner, and display the effect of a preselected entity processed by a hooked preview program. If a user does not hook a preview program, only the function of displaying a preselected entity in a zooming-in manner works in a result preview module.

In an example embodiment, the embodiment of the present application can further include a presetting module configured to hook the preview program before selecting the entity, and set the range threshold and the zooming-in factor. Specifically, the zooming-in factor is set in the presetting module, and the zooming-in factor should be at least twice an original entity in order to achieve a zooming-in effect.

In an example embodiment, the device of the present application can further include: a highlight display module configured to display the preselected entity in a predetermined highlight display manner, wherein the highlight display manner includes setting a line display property of the preselected entity, e.g. the linearity of the preselected entity can be changed into a dotted line, the linewidth of the preselected entity can be bolded, or a color of the preselected entity can also be changed and so on.

The highlight display module can include: a reading module, configured to read the entity information of the preselected entity;

a highlight processing module, configured to update the entity information of the preselected entity according to the preset display property so as to obtain the highlighted preselected entity. Specifically, the preselected entity can be processed according to the predetermined highlight display manner and the processed preselected entity is displayed.

It is implemented by the embodiment of the present application that filtering processing is performed based on a selected pickup point in a graphic system (e.g. a CAD graphic system) by the selecting module 30 and the filtering module 50, i.e. the range of entities is determined based on the pickup point, and the highlight display module displays an entity in this predetermined range as a selected object to a user. In addition, the preselected entity is displayed in a special highlight display manner to be distinguished from other entities. The user can determine a selected entity accurately without other unnecessary operations, thus solving the problem in the prior art that a user cannot obtain an entity accurately and simply in a graphic system, so as to further improve the accuracy of selecting a target entity in the graphic system.

Specifically, the embodiment can be applied in a scenario of selecting a plurality of complicated and disordered entities in a CAD graphic system, especially a device for selecting an entity on a mobile platform (e.g. a smart phone or a tablet computer). For example, the embodiment can overcome the disadvantage that an expected entity cannot be selected since a finger lifts to deviate from a pickup point during an operation of selecting an entity on a CAD system.

In an example embodiment, the selecting module 30 in the embodiment can further include: a prompting module configured to display a text to prompt the user to select the entity; a pickup point obtaining module configured to obtain the coordinate values of the pickup point picked up by the user on a mobile device, wherein the pickup point is not a fixed point, and the user can select the pickup point anywhere in a CAD graphic system on a display device. And pickup by sliding with a finger is supported. The present invention will obtain the final sliding point as the pickup point.

In the embodiment of the present application, the device can further include: a second determining module, configured to determine whether a current pickup point is the same as the last pickup point; a determining module configured to, in the case that the current pickup point is the same as the last pickup point, return to an operation of determining whether to end obtaining a pickup point, wherein if it is determined not to end obtaining the pickup point and the last pickup point is located in the predetermined range, obtain the last pickup point; otherwise, cancel display of a preselected entity corresponding to the current pickup point and/or cancel display of the preselected entity in the zoomed-in display area; in the case that the current pickup point is different from the last pickup point, execute the processing module 70 to process the preselected entity corresponding to the current pickup point via the hooked preview program. Specifically, the preselected entity corresponding to the last pickup point can be removed so as to display the preselected entity corresponding to the current pickup point.

In an example embodiment, the last preselected entity can be obtained in the case that obtaining of the pickup point is not ended, and the last preselected entity is located in the predetermined range.

Specifically, it is implemented by the embodiment that whether a current pickup point is the same with the last pickup point is determined, if yes, a determining module is invoked to determine to terminate a selection operation and return a preselected entity as a final result, and if no, an original state recovery module needs to be invoked to remove the preview effect of the last preselected entity and recover the entity to its original state, that is, if the effect of a preselected entity processed by a current original program is not selected, then after the finger of a user leaves the preselected entity on a display interface, the system deletes the effect of the preselected entity processed by the current preview program and recovers the preselected entity to a state before the processing so as to highlight the entity selected this time.

Wherein the determining module can include the following service functional modules: an operation determining module, configured to determine whether the user terminates a selection operation; if the user terminates the selection operation, invoke a preview removal module to perform a removal operation, e.g. the effect of the preselected entity previewed or highlighted on the drawing is cancelled and preview of the result of the preselected entity in the zoomed-in area is removed; and then invoke a result returning module to return the last preselected entity obtained by the filtering module 50, and if the operation is not terminated, the selecting module 30 is invoked to select a pickup point.

It can be learned from the foregoing that the solution provided by the present application displays the preselected entity in a highlight display manner so that the user can determine a selected entity accurately. In the meanwhile, an interface hooking the preview program of the user is provided so that the effect of the preselected entity processed by the command can be previewed in the zoomed-in area, thus improving the accuracy for the user to select an entity.

The present invention creates a zoomed-in area on a screen to display the content in the area around a touch point of a finger on the screen in a zooming-in manner, thus solving the problem that a target entity cannot be selected because it is shielded by a finger pad.

Besides, the present invention can preselect an entity during an entity selection process and displays the result of the pre-selection on a screen simultaneously, so that the user is able to know a selected entity after selection and the effect obtained after processing during the entity selection process.

Specifically, the present invention relates to entity selection applied in a CAD graphic system, especially a device for selecting an entity on a mobile platform (e.g. a smart phone or a tablet computer). The present invention is mainly applied to fields including a scenario of selecting a plurality of complicated and disordered entities in a CAD system, and so on.

Embodiment 2

Figure 2:
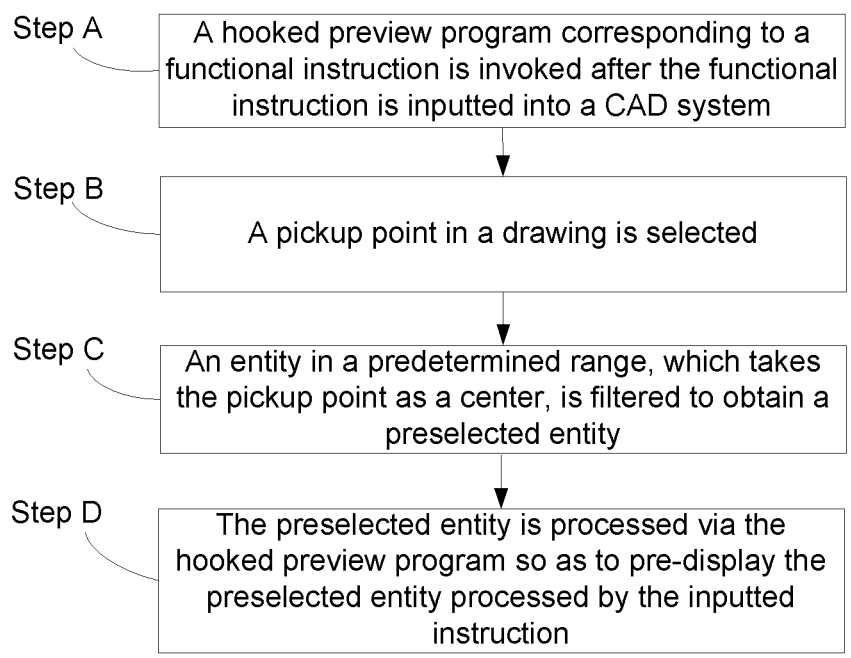
FIG. 2 is a flowchart of a method for selecting an entity in a drawing according to an embodiment of the present invention.
Figure 3:
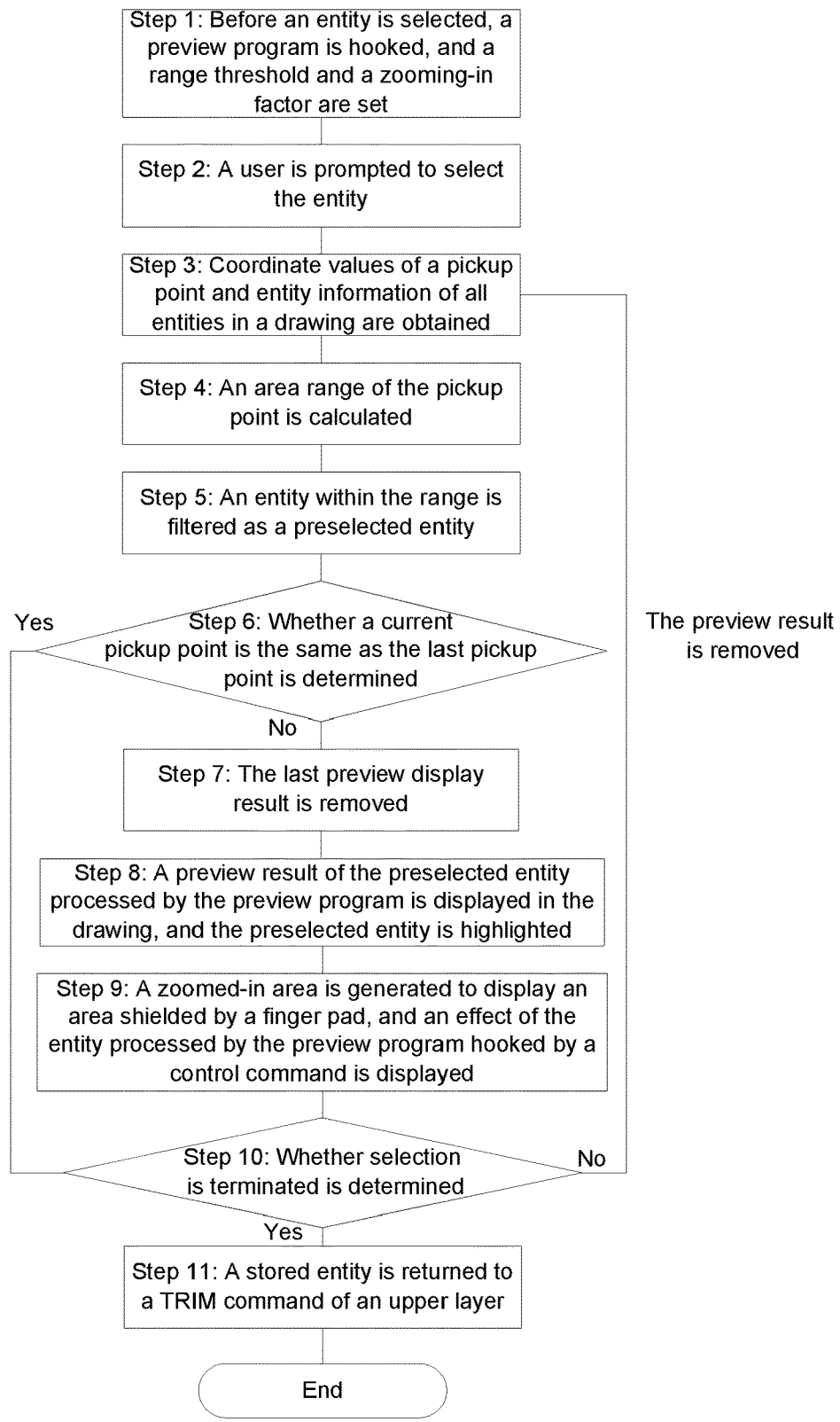
FIG. 3 is a detailed flowchart of a method for selecting an entity in a drawing according to an embodiment of the present invention.

FIG. 2 is a flowchart of a method for selecting an entity in a drawing according to an embodiment of the present invention, and FIG. 3 is a detailed flowchart of a method for selecting an entity in a drawing according to an embodiment of the present invention.

As shown in FIG. 2, the method includes the following steps.

Step A: A hooked preview program corresponding to a functional instruction can be invoked after the functional instruction is inputted into a CAD system through the invoking function as shown in FIG. 1.

Step B: A pickup point in a drawing can be selected through the selecting module 30 as shown in FIG. 1. Specifically, this step enables that a pickup point can be selected in a CAD graphic system.

Step C: It can be implemented by the selecting module 30 as shown in FIG. 1 that an entity in a predetermined range, which takes the pickup point as the center, is filtered to obtain a preselected entity. Specifically, this step enables that an entity in a certain area range, which takes the pickup point as the center, can be filtered as a preselected entity. The area range can be adjusted according to the size of the current display screen, e.g. a relatively large area can be preset on a display screen of a mobile phone while a relatively small display area can be preset on a display screen of a computer according to an actual condition.

Step D: It can be implemented through the highlight display module as shown in FIG. 1 that the preselected entity is processed via the hooked preview program to pre-display the result of the preselected entity processed by the inputted instruction. Specifically, the step implements a function for previewing a current preselected entity to display and preview the preselected entity on a drawing, so as to provide the user a preview of the effect of the preselected entity processed by the current control instruction.

In the embodiment of the present application, after inputting the functional instruction into the CAD system, the preview program hooked on the functional instruction is invoked, and after the filtering processing is implemented based on the selected pickup point in the graphic system (e.g. the CAD graphic system) so as to obtain the preselected entity, the preselected entity is processed by the hooked preview program so as to preview the effect of the selected entity processed by the CAD functional instruction, thus solving the problem in the prior art that the processing process of a control instruction needs to be performed repeatedly and working efficiency is reduced because a user needs to recover a graphic entity to a state before processing when a processing result, which can be learned by the user only after the control instruction is executed during the process of processing the graphic entity with the control instruction of a graphic system, is unsatisfactory, and further implementing preview of the effect of a selected entity processed by a control instruction, which avoids repeated selections of a graphic entity by the user to further improve working efficiency.

Specifically, it may be implemented through the solution above that a user does not need to "process a selected entity through a control command" before knowing whether a processing for the selected entity is satisfactory. If the processing is unsatisfactory, the user does not need to execute a backspace command on the CAD system to recover the entity to a state before the entity is processed by the command. The preselected entity can be processed through the preview program, and the effect of the processed preselected entity is displayed on the drawing, thus avoiding a lot of unnecessary work to further address a blind spot that a processing result cannot be foreseen during "the process of selecting an entity" and improving the accuracy for a user to select an entity. During a selection process, if a processing effect previewed by a user is unsatisfactory, a mouse or a finger can be moved to reselect a pickup point to obtain a new preselected entity, thus avoiding an unnecessary fallback operation after a current wrong selection.

In Step D of the embodiment of the present application, i.e. the step of processing the preselected entity via the hooked preview program to pre-display the result of the preselected entity processed by the inputted instruction can include the following steps.

Step D1: A user is prompted to select the entity, and after the user determines the pickup point, the system can obtain entity information of the preselected entity and coordinate values of the pickup point.

Step D2: A callback function in the preview program hooked to a control instruction is invoked. Specifically, the callback function can be Preview (Entity*ent, Point pt).

Step D3: The callback function transmits the entity information and the coordinate values as parameters into a preview processing function. Specifically, the entity information and the coordinate values of the pickup point can be transmitted into Preview (Entity*ent, Point pt) as parameters.

Step D4: The preview processing function performs preview processing to the preselected entity to obtain a preview processing result.

Step D5: The preview processing result is returned to the callback function in the preview program and the preview processing result is displayed, so as to display the entity information returned by the function, i.e. effect data of the processed preselected entity, to the current drawing.

Wherein, the preview processing result is the same with a result of processing the preselected entity by the control instruction to which the preview program is hooked. In the process above, if the last preview result of an entity exists before the preselected entity is processed by the preview program, the last preview result needs to be removed first.

Since the embodiment provides an interface to invoke the preview processing function by the callback function in the preview program, thus it is implemented that the control instruction is configured to preview the processing effect before processing the preselected entity.

In an example embodiment, Step D5 can further include the following steps after displaying the preview processing result.

Step D6: Whether to select the preview processing result is determined. If it is determined to select the preview processing result, Step D7 is performed. Otherwise, Step D8 is performed. Specifically, whether to select the preview processing result can be determined by determining whether the user inputs a selection acknowledgement instruction.

Step D7: At the moment, the entity information of the preselected entity can be returned to the control instruction hooking the preview program so as to enable the control instruction to process the preselected entity. Specifically, the preselected entity will be returned to the corresponding control instruction as a selected entity at the moment, and the control instruction performs corresponding processing to the selected entity.

Step D8: The preselected entity is recovered to a state before it is processed by the preview program. In this process, the preview processing result needs to be deleted in the background first, and then the state before the preselected entity is processed by the preview program is stored.

Specifically, it is implemented by the embodiment above that whether the user acknowledges a selection is determined. If yes, an entity is recovered to a state before it is processed by a function and then information of a preselected entity is returned to a command of an upper layer. If no, effect data displayed in a current drawing is deleted and original data information of the preselected entity is displayed in the drawing. Subsequently, a new preselected entity is obtained, and the hooked preview program is invoked again to process the new preselected entity.

In the embodiment of the present application, Step B, i.e. the step of filtering the entity in the predetermined range around the pickup point so as to obtain the preselected entity can further include the following steps.

Step B1: Coordinate values of all entities in the drawing are obtained. Specifically, the step provides an entity information obtaining module which can be configured to obtain data of all entities in the drawing, e.g. the coordinate values of the entities.

Step B2: An area range, which takes the pickup point as a center is calculated, according to a predetermined range threshold to obtain the predetermined range.

Step B3: The coordinate values of all entities are matched with the coordinate values of the pickup point, and matched with coordinate values of a point of the pickup point in the predetermined range to filter and obtain the preselected entity, wherein the preselected entity is a set of entities having completely identical or partially identical coordinate values as those of the pickup point and the points within the predetermined range around pickup point. Specifically, it is implemented by the step that an entity in the area range of a pickup point is matched as the preselected entity according to data of all entities, coordinate values of a current pickup point and threshold data. Since the predetermined range may not cover all entities, the range of the preselected entity may be the same as the predetermined range, or may be overlapped much with the predetermined range. Thus, it can be seen that coordinates of all entity points which constitute the preselected entity may be all in the predetermined range, or may be partly in the predetermined range. Apparently, coordinate values of the overlapped entities can be a range value, e.g. a range of overlapped entities on a display device may be larger than or equal to 1 pixel, and may be preferably 10 pixels, and a range of overlapped entities on a PC may also be larger than or equal to 1 pixel, and may be preferably 5 pixels. In addition, if no entity is matched in the area range of the pickup point, it is indicated that no entity is selected this time, and then a null value is returned to a subsequent processing module.

In the embodiment of the present application, after filtering the entity in the predetermined range around the pickup point so as to obtain the preselected entity, the method can further include the following steps that a predetermined zooming-in factor is obtained; calculation is performed according to the predetermined zooming-in factor and pixels of a display screen to obtain the size of a zoomed-in display area; specifically, the size of the zoomed-in area can be calculated according to the size of the screen and the zooming-in factor; the zoomed-in display area is created at a predetermined position of the display screen, i.e. the zoomed-in area is created and displayed according to the pickup point and the size of the screen on an appropriate position that cannot be shielded by a finger; the preselected entity is displayed in the zoomed-in display area, and/or the preselected entity processed by the highlight display manner is displayed. Specifically, the size of the zoomed-in area can be equal to the screen size multiplied by a proportionality coefficient t (the variable t can be a value set by the user, but the value cannot be larger than 1, thus ensuring that the size of the display area is always smaller than the size of the screen), and the size of a content displayed in the zoomed-in area is equal to multiplying pixels where the pickup point locates by the predetermined zooming-in factor.

Specifically, the embodiment above can be applied to display, in a zooming-in manner, the area for selecting an entity shielded by a finger pad, i.e. a function of previewing a preselected entity in a zoomed-in area is provided to generate a zoomed-in area in an appropriate position on a screen, display the area shielded by a finger pad in the zoomed-in area in a zooming-in manner, and display the effect of a preselected entity processed by a hooked preview program. If a user does not hook a preview program, only the function of displaying a preselected entity in a zooming-in manner works in a result preview module.

In an example embodiment, as shown in FIG. 3, the preview program can be hooked, and the range threshold and the zooming-in factor can be set before selecting the entity in the drawing. Specifically, the zooming-in factor set in the presetting module should be at least twice an original entity in order to achieve a zooming-in effect.

After filtering the entity in the predetermined range, which takes the pickup point as the center, so as to obtain the preselected entity, Step C in the embodiment of the present application can further include the following step that the preselected entity is displayed in a predetermined highlight display manner, wherein the highlight display manner includes setting a display property of the preselected entity, and the specific process of the step is as follows.

First, the entity information of the preselected entity is read.

Subsequently, the entity information of the preselected entity is updated according to the preset display property so as to obtain the highlighted preselected entity. Specifically, the preselected entity can be processed according to the predetermined highlight display manner and the processed preselected entity is displayed.

The embodiment of the present application performs filtering processing based on a selected pickup point in a graphic system (e.g. a CAD graphic system), i.e. the range of entities is determined based on the pickup point, and displays an entity in this predetermined range as a selected object to a user. In addition, the preselected entity is displayed in a special highlight display manner to be distinguished from other entities. The user can determine a selected entity accurately without other unnecessary operations, thus solving the problem in the prior art that a user cannot obtain an entity accurately and simply in a graphic system, so as to further improve the accuracy of selecting a target entity in the graphic system.

Specifically, the embodiment can be applied in a scenario of selecting a plurality of complicated and disordered entities in a CAD graphic system, especially a device for selecting an entity on a mobile platform (e.g. a smart phone or a tablet computer). For example, the disadvantage that an expected entity cannot be selected since a finger lifts to deviate from a pickup point during an operation of selecting an entity on a CAD system can be overcome. Thus it can be learned that the present invention can overcome the disadvantage that an expected entity cannot be selected since a finger lifts to deviate from a pickup point during an operation of selecting an entity on a CAD system, thus further addressing the problem that a selected entity cannot be previewed because the entity is shielded by a finger and improving the accuracy for selecting an entity on a CAD system, and the process result of a command on a selected entity can be previewed during the processing of selecting an entity.

In an example embodiment, the step of selecting the pickup point in the drawing according to Step A in the embodiment can include that a text is displayed to prompt the user to select the entity; the coordinate values of the pickup point picked up by the user on a mobile device are obtained, wherein the pickup point is not a fixed point, and the user can select the pickup point anywhere in a CAD graphic system on a display device, and pickup by sliding with a finger is supported. The present invention will obtain the final sliding point as the pickup point.

After filtering the entity in the predetermined range, which takes the pickup point as the center, so as to obtain the preselected entity, the embodiment of the present application can further include the following step that whether a current pickup point is the same as the last pickup point is determined, wherein in the case that the current pickup point is the same as the last pickup point, an operation of determining whether to end obtaining a pickup point is returned, wherein if it is determined not to end obtaining the pickup point and the last pickup point is obtained. Otherwise, display of a preselected entity corresponding to the current pickup point is cancelled, and/or display of the preselected entity in the zoomed-in display area is cancelled. In the case that the current pickup point is different from the last pickup point, a step of processing the preselected entity corresponding to the current pickup point via the hooked preview program is performed. Specifically, the last preselected entity can be removed so as to display the current preselected entity. In an example embodiment, the last pickup point can be obtained in the case that the obtaining of the pickup point is not ended and the last pickup point is located in the predetermined range.

It is implemented by the embodiment that whether a current preselected entity is the same with the last preselected entity is determined; if yes, it is determined to terminate a selection operation and the preselected entity is returned as the final result, and if no, an original state recovery module needs to be invoked to remove the preview effect of the last preselected entity and recover the entity to its original state, that is, if the effect of a preselected entity processed by a current original program is not selected, then after the finger of a user leaves the preselected entity on a display interface, the system deletes the effect of the preselected entity processed by the current preview program and recovers the preselected entity to a state before the processing so as to highlight the entity selected this time.

In an example embodiment, whether the user terminates a selection operation further needs to be determined; if the user terminates the selection operation, the preview removal module is invoked to perform a removal operation, e.g. the effect of the preselected entity previewed or highlighted on the drawing is cancelled and preview of the result of the preselected entity in the zoomed-in area is removed; and then a result returning module is invoked to return the last preselected entity obtained by filtering, and if the operation is not terminated, a pickup point is selected.

It can be learned from the foregoing that the solution provided by the present application displays the preselected entity in a highlight display manner so that the user can determine a selected entity accurately. In the meanwhile, an interface hooking the preview program of the user is provided so that the effect of the preselected entity processed by the command can be previewed in the zoomed-in area, thus improving the accuracy for the user to select an entity.

The embodiments of the device and the method for selecting an entity in a drawing in the present application can be implemented in the application environment of a CAD graphic system. As shown in FIG. 3, the process of an embodiment of the present invention and its steps will be expounded below based on the example of a TRIM command in a CAD graphic system in conjunction with invoking of the TRIM command.

Figure 4:
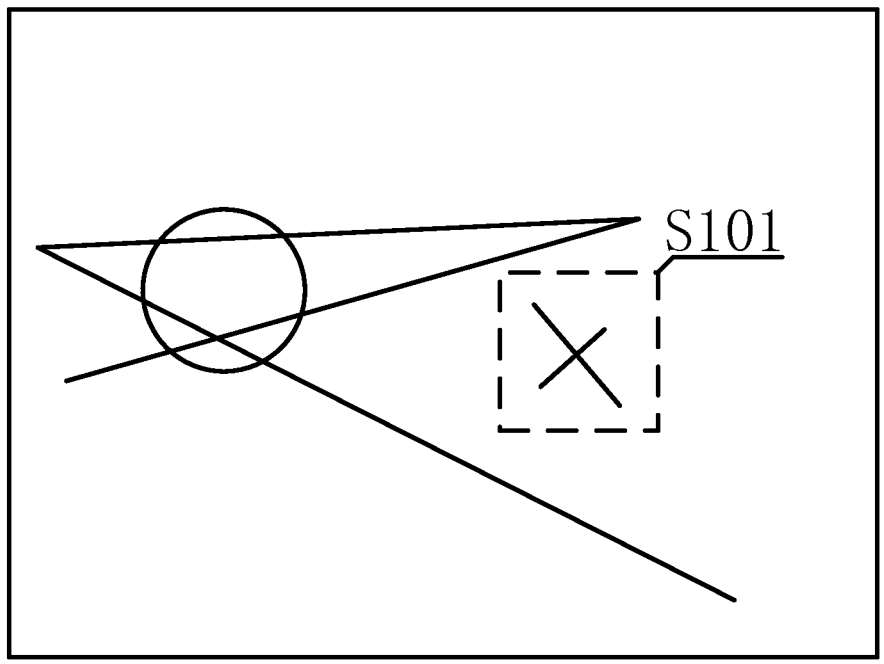
FIG. 4 is a functional diagram of an initial interface of a TRIM command according to the embodiment as shown in FIG. 3.
Figure 5:
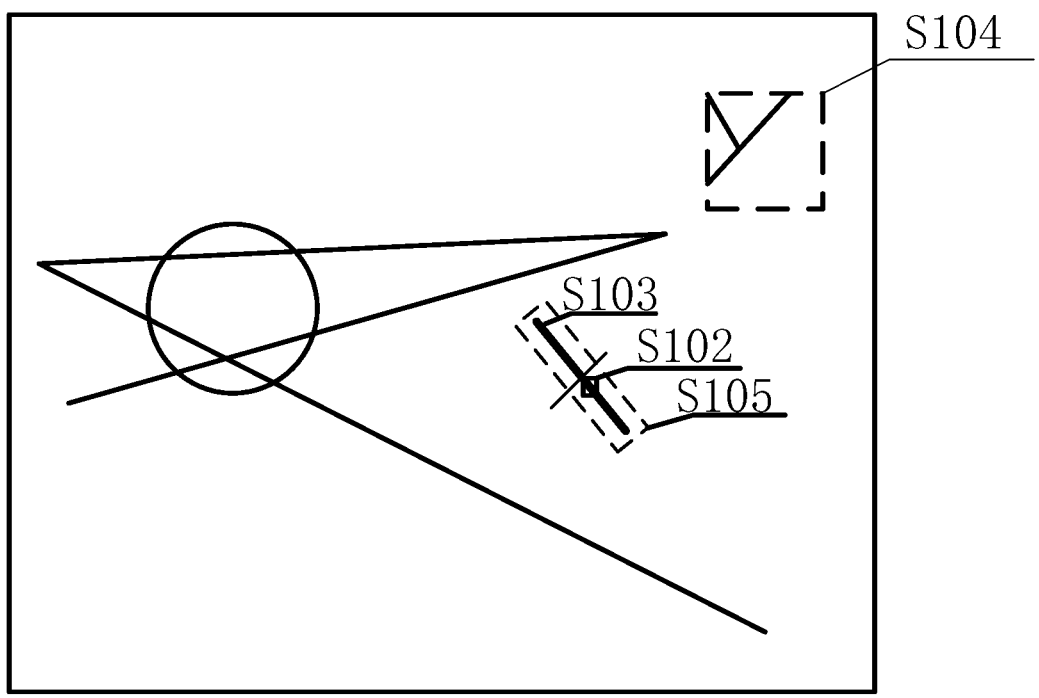
FIG. 5 is a functional diagram of an operation of a TRIM command according to the embodiment as shown in FIG. 3.
Figure 6:
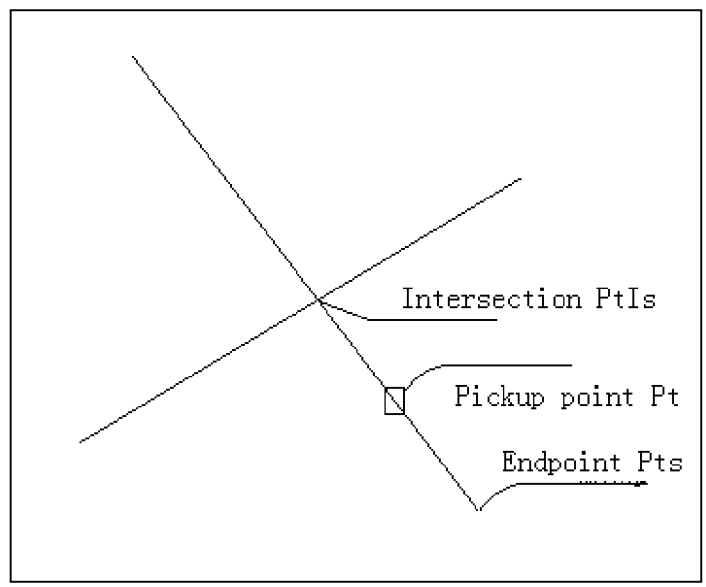
FIG. 6 is a schematic diagram of a trim source entity of a operation of a TRIM command and information of a pickup point according to the embodiment as shown in FIG. 5.

FIG. 3 is a detailed flowchart of a method for selecting an entity in a drawing according to an embodiment of the present invention; FIG. 4 is a functional diagram of an initial interface of a TRIM command according to the embodiment as shown in FIG. 3; FIG. 5 is a functional diagram of an operation of a TRIM command according to the embodiment as shown in FIG. 3; and FIG. 6 is a schematic diagram of a trim source entity of a operation of a TRIM command and information of a pickup point according to the embodiment as shown in FIG. 5.

As shown in FIG. 3, the TRIM command therein is an operation method for trimming an entity object so that the entity object can be connected to a side of another entity object in a CAD graphic system. The operation method of the TRIM command is to select an entity to be trimmed as a trim source first and then select a trim side.

As shown in FIG. 4, there are some complicated graphic primitive entities in a CAD graphic system of a mobile device. A user has selected two straight line entities in the area S101 in FIG. 4 as a trim source of the TRIM command. The trim source is configured to be a target entity operated by the TRIM command in the CAD graphic system, and select an entity as a trim side. Specific steps are as shown in FIG. 4, including the following steps.

Step 1: A command preview program is hooked before an entity is selected, and a range threshold and a zooming-in factor are set.

Step 2: A user is prompted to select an entity to be subjected to a trimming operation of the TRIM command. Specifically, the TRIM command invokes the entity selected by the user as a trim entity.

Step 3: As shown in FIG. 5, a pickup point S102 is selected, and coordinate values of the pickup point S102 on the user's screen and information of all entities in the drawing are obtained.

Specifically, as shown in FIG. 6, the pickup point S102 can be pickup point pt, and the pickup point S102 identifies an operation point or a selection point for the user to select an entity when the TRIM command is executed. Since S101 identifies the entity required for executing the TRIM command, S102 can be a point on the entity identified by S101.

Step 4: The area range of the pickup point S102 is calculated, as shown by S105 in FIG. 5. The area range S105 corresponding to the pickup point S102 is determined according to the predetermined range threshold.

Step 5: An entity in the range S105 is filtered. If the entity S103 in FIG. 5 is in the area range, then the entity is used as a current preselected entity. If no entity is filtered in the range S105, then a null value is returned. Specifically, an entity within the pre-selection range of pickup point pt is filtered as preselected entity ent.

Step 6: Whether the current preselected entity is the same with the last preselected entity is determined. If yes, Step 10 is performed. Otherwise, Step 7 is performed.

Step 7: The preview display effect of the last preselected entity is removed in order to display a current preview result.

Step 8: The preview result of the preselected entity processed by the preview program is displayed on the drawing, and the preselected entity S103 is highlighted. As shown in FIG. 5, a highlight display method displaying linewidth in boldface is applied here, but it is not limited to display linewidth in boldface as shown in FIG. 5. Other methods include setting a line as a dotted line, changing color and so on.

Step 9: A zoomed-in area is generated to display the area shielded by a finger pad, and the effect of the preselected entity processed by the preview program hooked by a control instruction is displayed, wherein the step of displaying the effect of the preselected entity processed by the preview program hooked by the control instruction can specifically include the following steps.

First, a callback function Preview (Entity*ent, Point pt) of the TRIM command is invoked, and the obtained entity information ent of the preselected entity and coordinates pt of the pickup point are transmitted into a preview processing function.

Then, a line segment to be trimmed of the preselected entity is determined according to coordinate values pt in the function Preview hooked by the TRIM command.

Subsequently, as shown in FIG. 6, the preview processing function modifies coordinate values of the endpoint pts of the line segment to be trimmed into coordinate values of an intersection PtIns with another trim source entity related to the preselected entity to obtain a preview processing result.

At the moment, the modified entity information ent is returned as a result of the callback function. That is, the preview processing result is returned.

Finally, the entity information returned by the function, i.e. data ent of the preview processing result obtained after the preselected entity is processed by the preview program, is displayed in the current drawing.

The size of the zoomed-in display area is calculated according to the zooming-in factor and pixels of the screen. The zoomed-in area is displayed in an appropriate position on the screen, and a stored entity is displayed in the zoomed-in area. If the user hooks the command preview program in Step 1, then the program is invoked to process the entity, and a processing result is then obtained and displayed in the zoomed-in area, as shown by S104 in the figure above.

Step 10: Whether selection is terminated is determined. If yes, Step 11 is performed. Otherwise, the preview display effect is removed, and Step 3 is performed to obtain a pickup point again.

Step 11: The last preselected entity obtained through filtering is returned to a TRIM command of an upper layer and the current selection operation is terminated.

It should be clearly understood here that, the embodiments of the method and the device for selecting an entity in a drawing of the present application can be applied in the operation of a TRIM command in a CAD drawing and can also be applied to other operations in a CAD drawing, such as the followings.

a. The embodiments can be applied in an offset command (an entity deleting command). A user is prompted to select an entity after the command is inputted, and then the solution provided by the embodiments of the present application is invoked to select the entity on a CAD system. Finally, a preview result is displayed to an offset command of an upper layer in a highlight and/or zooming-in manner.

b. The embodiments can be applied in a chamfer command (an entity copying command). A user is prompted to select and copy an entity after the command is inputted, and then the solution provided by the embodiments of the present application is invoked to select the entity and perform a copying operation. Finally, a preview result is displayed to a chamfer command of an upper layer in a highlight and/or zooming-in manner.

c. The embodiments can be applied in a Mirror command (an entity mirroring command). A user is prompted to select a mirror entity after the command is executed, and then the solution provided by the embodiments of the present application is invoked to select the mirror entity. Finally, a preview result is displayed to a Mirror command of an upper layer in a highlight and/or zooming-in manner.

d. The embodiments can be applied in an Array command (an entity arraying command). A user is prompted to select an entity and perform arraying after the command is executed, and then the solution provided by the embodiments of the present application is invoked to select the entity. Finally, a preview result is displayed to an Array command of an upper layer in a highlight and/or zooming-in manner.

Embodiment 3

It needs to be noted here that an embodiment of the present invention may further provide a computer terminal. The computer terminal may be any computer terminal device in a computer terminal group. Optionally, the computer terminal may be also alternatively a terminal device including a mobile terminal and so on in the present embodiment.

In the present embodiment, the computer terminal may execute program codes of the following steps in a method for selecting an entity in a drawing.

Step 1: A hooked preview program corresponding to a functional instruction is invoked after the functional instruction is inputted into a CAD system.

Step 3: A pickup point in a drawing is selected.

Step 5: An entity in a predetermined range is filtered around the pickup point to obtain a preselected entity.

Step 7: The preselected entity is processed via the hooked preview program so as to pre-display a result of processing the preselected entity by the inputted instruction.

Figure 7:
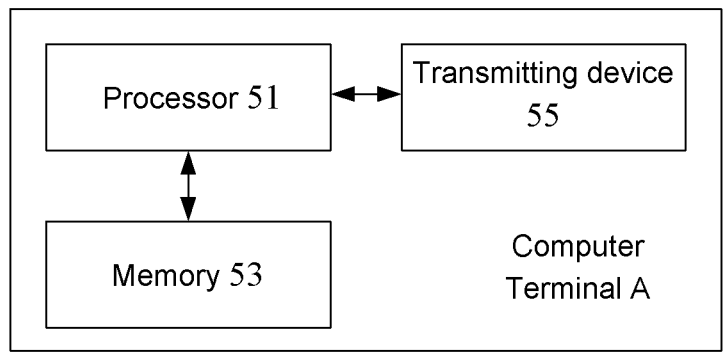
FIG. 7 is a structure block diagram of a computer terminal according to an embodiment of the present invention.

Optionally, FIG. 7 is a structure block diagram of a computer terminal according to an embodiment of the present invention. As shown in FIG. 7, the computer terminal A can include: one or more (only one is shown in the figure) processors 51, a memory 53, and a transmitting device 55.

Wherein, the memory 53 may be configured to store a software program and a module, e.g. a program instruction/module corresponding to a method and a device for selecting an entity in a drawing in an embodiment of the present invention. The processor 51 runs the software program and the module stored in the memory 53 so as to execute various functional applications and data processing, i.e. the processor implements the method for selecting an entity in a drawing. The memory 53 can include a high speed Random-Access Memory (RAM) and can also include a nonvolatile memory, e.g. one or more magnetic storage devices, a flash memory, or other nonvolatile solid-state memories. In some examples, the memory 53 can further include a memory set remotely relative to the processor 51. These remote memories may be connected to the terminal A through a network. An example of the network includes, but is not limited to the Internet, an intranet, a local area network, a mobile communication network and a combination thereof.

The transmitting device 55 is configured to receive or transmit data through a network. A specific example of the network can include a wire network and a wireless network. In an example, the transmitting device 55 includes a Network Interface Controller (NIC) which may be connected to other network devices and a router through a cable so as to communicate with the Internet or a local area network. In an example, the transmitting device 55 is a Radio Frequency (RF) module configured to communicate with the Internet wirelessly.

Wherein, the memory 53 is specifically configured to store a condition of a predetermined action, information of a user having a predetermined authority, and an application.

The processor 51 can invoke information and the application stored by the memory 53 through the transmitting device so as to perform the following steps. A hooked preview program corresponding to a functional instruction is invoked after the functional instruction is inputted into a CAD system. A pickup point in a drawing is selected. An entity in a predetermined range is filtered around the pickup point to obtain a preselected entity. The preselected entity is processed via the hooked preview program so as to pre-display a result of processing the preselected entity by the inputted instruction.

Optionally, the processor 51 can further execute program codes of the following steps. Entity information of the preselected entity and coordinate values of the pickup point are obtained. A callback function in the preview program hooked to a control instruction is invoked. The callback function transmits the entity information and the coordinate values as parameters into a preview processing function. The preview processing function performs preview processing to the preselected entity to obtain a preview processing result. The preview processing result is returned to the callback function in the preview program and the preview processing result is displayed, wherein the preview processing result is the same with the result of the preselected entity processed by the control instruction hooking the preview program.

Optionally, the processor 51 can further execute program codes of the following steps. Whether to select the preview processing result is determined. If it is determined to select the preview processing result, the entity information of the preselected entity is returned to the control instruction hooking the preview program so as to enable the control instruction to process the preselected entity. If it is determined not to select the preview processing result, the preselected entity is recovered to a state before the preselected entity is processed by the preview program.

Optionally, the processor 51 can further execute program codes of the following steps. Coordinate values of all entities in the drawing are obtained. An area range, which takes the pickup point as a center is calculated, according to a predetermined range threshold to obtain the predetermined range. The coordinate values of all entities are matched with the coordinate values of the pickup point, and matched with coordinate values of a point of the predetermined range to filter and obtain the preselected entity, wherein the preselected entity is a set of entities having completely identical or partially identical coordinate values as those of the pickup point and the points within the predetermined range around pickup point.

Optionally, the processor 51 can further execute program codes of the following steps. A predetermined zooming-in factor is obtained. Calculation is performed according to the predetermined zooming-in factor and pixels of a display screen to obtain a size of a zoomed-in display area. The zoomed-in display area is created at a predetermined position of the display screen. The preselected entity or the preselected entity processed by the hooked preview program is displayed in the zoomed-in display area.

Optionally, the processor 51 can further execute program codes of the following steps. The entity information of the preselected entity is read. The entity information of the preselected entity is updated according to the preset display property so as to obtain the highlighted preselected entity.

Optionally, the processor 51 can further execute program codes of the following steps. Whether a current pickup point is the same as the last pickup point is determined, wherein in the case that the current pickup point is the same as the last pickup point, an operation of determining whether to end obtaining a pickup point is performed again, wherein if it is determined not to end obtaining the pickup point and the last pickup point is located in the predetermined range, the last pickup point is obtained. Otherwise, display of a preselected entity corresponding to the current pickup point is cancelled. In the case that the current pickup point is the different from the last pickup point, a step of processing a preselected entity corresponding to the current pickup point via the hooked preview program is performed.

Those of ordinary skill in the art may understand that the structure as shown in FIG. 7 is only schematic. The computer terminal may be also a terminal device including a smart phone (e.g. an ANDROID phone, an IPHONE Operating System (iOS) phone etc.), a tablet computer, a palm computer, a Mobile Internet Device (MID) and a PAD and so on. FIG. 7 does not limit structures of the electronic devices above. For example, the computer terminal A may also include more or less components (network interfaces, display devices, and so on) than those as shown in FIG. 7, or provided with configuration different from that as shown in FIG. 10.

Those of ordinary skill in the art may understand that all or part of the steps in various methods of the foregoing embodiments may be implemented by terminal device-related hardware instructed by a program. The program may be stored in a computer-readable storage medium. The storage medium may include a flash disk, a Read-Only Memory (ROM), an RAM, a magnetic disk or an optical disk and so on.

Embodiment 4

It also needs to be noted here that an embodiment of the present invention further provides a storage medium. Optionally, in the present embodiment, the storage medium may be configured to store program codes executed by the method for selecting an entity in a drawing according to the first embodiment.

Optionally, in the present embodiment, the storage medium may be located in any computer terminal in a computer terminal group in a computer network, or located in any mobile terminal in a mobile terminal group.

Optionally, in the present embodiment, the storage medium is configured to store program codes configured to execute the following steps. A hooked preview program corresponding to a functional instruction is invoked after the functional instruction is inputted into a CAD system. A pickup point in a drawing is selected. An entity in a predetermined range is filtered around the pickup point to obtain a preselected entity. The preselected entity is processed via the hooked preview program so as to pre-display a result of processing the preselected entity by the inputted instruction.

Optionally, the storage medium is further configured to store program codes configured to execute the following steps. Entity information of the preselected entity and coordinate values of the pickup point are obtained. A callback function in the preview program hooked to a control instruction is invoked. The callback function transmits the entity information and the coordinate values as parameters into a preview processing function. The preview processing function performs preview processing to the preselected entity to obtain a preview processing result. The preview processing result is returned to the callback function in the preview program and the preview processing result is displayed, wherein the preview processing result is the same with a result of processing the preselected entity by the control instruction to which the preview program is hooked.

Optionally, the storage medium is further configured to store program codes configured to execute the following steps. Whether to select the preview processing result is determined. If it is determined to select the preview processing result, the entity information of the preselected entity is returned to the control instruction hooking the preview program so as to enable the control instruction to process the preselected entity. If it is determined not to select the preview processing result, the preselected entity is recovered to a state before the preselected entity is processed by the preview program.

Optionally, the storage medium is further configured to store program codes configured to execute the following steps. Coordinate values of all entities in the drawing are obtained. An area range, which takes the pickup point as the center is calculated, according to a predetermined range threshold to obtain the predetermined range. The coordinate values of all entities are matched with the coordinate values of the pickup point, and matched with coordinate values of a point of the predetermined range to filter and obtain the preselected entity, wherein the preselected entity is a set of entities having completely identical or partially identical coordinate values as those of the pickup point and the points within the predetermined range around pickup point.

Optionally, the storage medium is further configured to store program codes configured to execute the following steps. A predetermined zooming-in factor is obtained. Calculation is performed according to the predetermined zooming-in factor and pixels of a display screen to obtain a size of a zoomed-in display area. The zoomed-in display area is created at a predetermined position of the display screen. The preselected entity or the preselected entity processed by the hooked preview program is displayed in the zoomed-in display area.

Optionally, the storage medium is further configured to store program codes configured to execute the following steps. The entity information of the preselected entity is read. The entity information of the preselected entity is updated according to the preset display property so as to obtain the highlighted preselected entity.

Optionally, the storage medium is further configured to store program codes configured to execute the following steps. Whether a current pickup point is the same as the last pickup point is determined, wherein in the case that the current pickup point is the same as the last pickup point, an operation of determining whether to end obtaining a pickup point is performed again, wherein if it is determined not to end obtaining the pickup point and the last pickup point is located in the predetermined range, the last pickup point is obtained. Otherwise, display of a preselected entity corresponding to the current pickup point is cancelled. In the case that the current pickup point is the different from the last pickup point, a step of processing a preselected entity corresponding to the current pickup point via the hooked preview program is performed.

Optionally, in the present embodiment, the storage medium may include, but is not limited to various mediums that can store program codes, including a Universal Serial Bus (USB) disk, an ROM, an RAM, a mobile hard disk drive, a magnetic disk or an optical disk, and so on.

Optionally, specific examples in the present invention may refer to the examples described in the first embodiment and the second embodiment, and will not be described repeatedly in the present embodiment.

The sequence numbers in the embodiments of the present invention are merely for description, and do not represent preference of the embodiments.

It may be seen from the foregoing description that the following technical effect is embodied in the embodiments of the present invention. The present invention highlights an entity in a range where a pickup point locates during a process of selecting an entity, and invokes a hooked command preview program in a zoomed-in area to process the entity and preview an effect, thus improving the accuracy for a user to select an entity, and addressing the problem of repeated selections and inaccurate selections of the user.

It needs to be noted that the steps shown in the flowcharts of the accompanying drawings may be executed in a computer system such as a group of computer executable instructions. Moreover, although logic sequences have been shown in the flowcharts, the steps shown or described may be executed in a sequence different from a sequence here in some cases.

The principles of the present invention are operational with other general-purpose or special-purpose computing or communications environments or configurations. Examples of well-known computing systems, environments, and configurations applicable to the present invention include, but are not limited to PCs, servers, multiprocessor systems, systems based on micro-processing, minicomputers, mainframe computers, and distributed computing environments that include any of the above systems or devices.

As used in the present invention, the term "module", "component" or "unit" may refer to a software object or a routine executed on an updating unit of configuration information. Different components, modules, units, engines, and services described herein may be implemented as objects or processes executed (e.g. as separate threads) on an access system of a flag bit. While the systems and methods described herein are preferably implemented in software, implementations in hardware or a combination of software and hardware are also possible and conceivable.

The embodiments in the present specification are described in a progressive manner. The same or similar parts among the embodiments may refer to each other. The description of each embodiment focuses on the difference compared with other embodiments. In particular, for the embodiments of systems, their description is relatively simple, as they are substantially similar to the embodiments of methods, and thus, relevant parts may refer to some description of the embodiments of methods.

Obviously, those skilled in the art should understand that the modules or steps of the present invention may be implemented by general-purpose computing devices and centralized in a single computing device or distributed over a network consisting of a plurality of computing devices. Optionally, they may be implemented by program codes executable by a computing device, so that they may be stored in a storage device and executed by the computing device, or they may be implemented by respectively fabricating them into respective integrated circuit modules or by fabricating a plurality of modules or steps of them into a single integrated circuit module. By doing so, the present invention is not limited to any specific combination of hardware and software.

The above are only example embodiments of the present invention and should not be used for limiting the present invention. For those skilled in the art, the present invention may have various modifications and changes. Any modifications, equivalent replacements, improvements and the like within the spirit and principle of the present invention shall fall within the scope of protection of the present invention.

What is claimed is:

1. A method for selecting an entity in a drawing, which is executed by a mobile phone, comprising:
    receiving, from a touch screen of the mobile phone, an input data indicating a movement of a user's finger on the touch screen;
    invoking a hooked preview program corresponding to a functional instruction after the functional instruction is inputted into a Computer Aided Design (CAD) system;
    selecting a first pickup point in a drawing based on the input data;
    filtering an entity in a predetermined range around the first pickup point to obtain a preselected entity;
    processing the preselected entity via the hooked preview program to display a preview of a result of processing the preselected entity by the functional instruction;
    obtaining a predetermined zooming-in factor;
    performing calculation according to the predetermined zooming-in factor and pixels of the touch screen to obtain a size of a zoomed-in display area;
    creating the zoomed-in display area at a predetermined position of the touch screen according to the first pickup point and the size of the touch screen, wherein the zoomed-in area is not shielded by the finger;
    displaying, in the zoomed-in display area, the preselected entity or the preselected entity processed by the hooked preview program; and
    after displaying the preview of the result of processing the preselected entity:
        receiving a user selection associated with the result of processing the preselected entity, wherein the user selection comprises movement of the user's finger on the touch screen;
        in response to the user selection indicating to select the result of processing the preselected entity, returning entity information of the preselected entity to a control instruction to which the preview program is hooked, to enable the control instruction to process the preselected entity; and
        in response to the user selection indicating to not select the result of processing the preselected entity, recovering the preselected entity to a state before the preselected entity has been processed by the preview program by deleting the result of processing the preselected entity in a background, and storing the state before the preselected entity was processed by the hooked preview program.

2. The method according to claim 1, processing the preselected entity via the hooked preview program to display a preview of the result of the preselected entity processed by the functional instruction comprises:
    obtaining entity information of the preselected entity and coordinate values of the pickup point;
    invoking a callback function in the preview program hooked to a control instruction;
    transmitting, by the callback function, the entity information and the coordinate values as parameters into a preview processing function;

performing, by the preview processing function, preview processing to the preselected entity to obtain a preview processing result; and returning the preview processing result to the callback function in the hooked preview program and displaying the preview processing result;

wherein the preview processing result is the same with the result of processing the preselected entity by the control instruction to which the hooked preview program is hooked.

3. The method according to claim 1 wherein the filtering the entity in the predetermined range around the pickup point to obtain the preselected entity comprises:

obtaining coordinate values of all entities in the drawing;

calculating an area range, which takes the pickup point as a center, according to a predetermined range threshold to obtain the predetermined range; and matching the coordinate values of all entities with the coordinate values of the pickup point, and matching the coordinate values of all entities with coordinate values of points within the predetermined range to filter and obtain the preselected entity, wherein the preselected entity is a set of entities having completely identical or partially identical coordinate values as those of the pickup point and the points within the predetermined range around the pickup point.

4. The method according to claim 1, wherein after filtering the entity in the predetermined range around the pickup point to obtain the preselected entity, the method further comprises: displaying the preselected entity in a predetermined highlight display manner, wherein the highlight display manner comprises: setting a display property of the preselected entity, and setting the display property of the preselected entity comprises:

reading entity information of the preselected entity; and updating the entity information of the preselected entity according to a preset display property to obtain the highlighted preselected entity.

5. The method according to claim 4, wherein before displaying the preselected entity in the predetermined highlight display manner, the method further comprises:

determining whether a current pickup point is the same as the last pickup point, wherein in response to determining that the current pickup point is the same as the last pickup point, returning to an operation of determining whether to end obtaining a pickup point, wherein in response to determining not to end obtaining the pickup point and in response to determining that the last pickup point is located in the predetermined range, obtaining the last pickup point; otherwise, cancelling display of a preselected entity corresponding to the current pickup point;

wherein in response to determining that the current pickup point is different from the last pickup point, performing a step of processing the preselected entity corresponding to the current pickup point via the hooked preview program.

6. The method according to claim 1, wherein the method further includes: in response to the user selection indicating to not select the result of processing the preselected entity, selecting a second pickup point to obtain a new preselected entity.

7. A mobile phone for selecting an entity in a drawing, the mobile phone comprising:

a touch screen, configured to receive an input data corresponding to a movement of a user's finger on the touch screen of the mobile phone; and a processor, wherein the processor is configured to execute a plurality of program modules stored in a memory, the plurality of program modules comprising:

an invoking module, configured to invoke a hooked preview program corresponding to a functional instruction after the functional instruction is inputted into a Computer Aided Design system;

a selecting module, configured to select a first pickup point in a drawing based on the input data, wherein the first pickup point is not shielded by the user's finger;

a filtering module, configured to filter an entity in a predetermined range around the first pickup point to obtain a preselected entity;

a displaying module, configured to display the preselected entity in a predetermined highlight display manner, wherein the highlight display manner comprises setting a display property of the preselected entity by:

reading entity information of the preselected entity; and updating the entity information of the preselected entity according to a preset display property to obtain a highlighted preselected entity;

a processing module, configured to process the preselected entity via the hooked preview program to display a preview of a result of processing the preselected entity by the functional instruction;

a first determining module, configured to, after displaying a preview of the result of processing the preselected entity, receiving a user selection associated with the result of processing the preselected entity;

a returning module, configured to return, in response to the user selection indicating to select the result of processing the preselected entity, the entity information of the preselected entity to a control instruction to which the preview program is hooked, to enable the control instruction to process the preselected entity; and a recovering module, configured to recover, in response to the user selection indicating not to select the result of processing the preselected entity, the preselected entity to a state before the preselected entity has been processed by the preview program by recovering and storing the state before the preselected entity has been processed by the preview program.

8. The mobile phone according to claim 7, wherein the processing module comprises:

a first obtaining module, configured to obtain entity information of the preselected entity and coordinate values of the pickup point;

an invoking sub-module, configured to invoke a callback function in the preview program hooked to a control instruction;

a transmitting module, configured to transmit, by the callback function, the entity information and the coordinate values as parameters into a preview processing function;

a preview processing module, configured to perform, by the preview processing function, preview processing to the preselected entity to obtain a preview processing result;

a display module, configured to return the preview processing result to the callback function in the preview program and display the preview processing result;

wherein the preview processing result is the same with a result of processing the preselected entity by the control instruction to which the preview program is hooked.

9. The mobile phone according to claim 8, wherein the filtering module comprises:
a second obtaining module, configured to obtain coordinate values of all entities in the drawing;
a first calculating module, configured to calculate an area range, which takes the pickup point as a center, according to a predetermined range threshold to obtain the predetermined range; and
an entity matching module, configured to match the coordinate values of all entities with the coordinate values of the pickup point, and match the coordinate values of all entities with coordinate values of points within the predetermined range to filter and obtain the preselected entity, wherein the preselected entity is a set of entities having completely identical or partially identical coordinate values as those of the pickup point and the points within the predetermined range around pickup point.

10. The mobile phone according to claim 8, wherein the mobile phone further comprising:
a third obtaining module, configured to obtain a predetermined zooming-in factor;
a second calculating module, configured to perform calculation according to the predetermined zooming-in factor and pixels of a display screen to obtain a size of a zoomed-in display area;
a creating module, configured to create the zoomed-in display area at a predetermined position of the display screen; and
a zooming-in display module, configured to display, in the zoomed-in display area, the preselected entity, or the preselected entity processed by the hooked preview program.

11. The mobile phone according to claim 7, wherein the mobile phone further comprising:
a third obtaining module, configured to obtain a predetermined zooming-in factor;
a second calculating module, configured to perform calculation according to the predetermined zooming-in factor and pixels of a display screen to obtain a size of a zoomed-in display area;
a creating module, configured to create the zoomed-in display area at a predetermined position of the display screen;
a zooming-in display module, configured to display, in the zoomed-in display area, the preselected entity, or the preselected entity processed by the hooked preview program.

12. The mobile phone according to claim 11, wherein the filtering module comprises:
a second obtaining module, configured to obtain coordinate values of all entities in the drawing;
a first calculating module, configured to calculate an area range, which takes the pickup point as a center, according to a predetermined range threshold to obtain the predetermined range;
an entity matching module, configured to match the coordinate values of all entities with the coordinate values of the pickup point, and match the coordinate values of all entities with coordinate values of points within the predetermined range to filter and obtain the preselected entity, wherein the preselected entity is a set of entities having completely identical or partially identical coordinate values as those of the pickup point and the points within the predetermined range around pickup point.

13. The mobile phone according to claim 7, wherein the mobile phone further comprises:
a second determining module, configured to determine whether a current pickup point is the same as the last pickup point; and
a determining module, configured to, in response to determining that the current pickup point is the same as the last pickup point, return to an operation of determining whether to end obtaining a pickup point, wherein in response to determining not to end obtaining the pickup point and determining that the last pickup point is located in the predetermined range, obtain the last pickup point; otherwise, cancel obtaining of the current pickup point; in response to determining that the current pickup point is different from the last pickup point, execute the processing module to process the preselected entity corresponding to the current pickup point via the hooked preview program.

14. The mobile phone according to claim 7 wherein the filtering module comprises:
a second obtaining module, configured to obtain coordinate values of all entities in the drawing;
a first calculating module, configured to calculate an area range, which takes the pickup point as a center, according to a predetermined range threshold to obtain the predetermined range; and
an entity matching module, configured to match the coordinate values of all entities with the coordinate values of the pickup point, and match the coordinate values of all entities with coordinate values of points within the predetermined range to filter and obtain the preselected entity, wherein the preselected entity is a set of entities having completely identical or partially identical coordinate values as those of the pickup point and the points within the predetermined range around pickup point.

15. A method for selecting an entity in a drawing, which is executed by a mobile phone, comprising:
receiving, from a touch screen of the mobile phone, an input data indicating a movement of a user's finger on the touch screen;
invoking a hooked preview program corresponding to a functional instruction after the functional instruction is inputted into a Computer Aided Design (CAD) system;
selecting a first pickup point in a drawing based on the input data, wherein the first pickup point is not shielded by the user's finger;
filtering an entity in a predetermined range around the first pickup point to obtain a preselected entity;
processing the preselected entity via the hooked preview program to display a preview of a result of processing the preselected entity by the functional instruction;
displaying the preselected entity in a predetermined highlight display manner, wherein the highlight display manner comprises setting a display property of the preselected entity by:
reading entity information of the preselected entity; and
updating the entity information of the preselected entity according to a preset display property to obtain a highlighted preselected entity; and
after displaying the preview of the result of processing the preselected entity:

receiving a user selection associated with the result of processing the preselected entity, wherein the user selection comprises movement of the user's finger on the touch screen;
in response to the user selection indicating to select the result of processing the preselected entity, returning entity information of the preselected entity to a control instruction to which the preview program is hooked, to enable the control instruction to process the preselected entity; and
in response to the user selection indicating to not select the result of processing the preselected entity, recovering the preselected entity to a state before the preselected entity has been processed by the preview program by deleting the result of processing the preselected entity in a background, and storing the state before the preselected entity was processed by the hooked preview program.

16. The method according to claim 15, wherein after processing the preselected entity via the hooked preview program, the method further comprises:
obtaining a predetermined zooming-in factor;
performing calculation according to the predetermined zooming-in factor and pixels of a display screen to obtain a size of a zoomed-in display area;
creating the zoomed-in display area at a predetermined position of the display screen;
displaying, in the zoomed-in display area, the preselected entity or the preselected entity processed by the hooked preview program.

17. A mobile phone for selecting an entity in a drawing, the mobile phone comprising:
a touch screen, configured to receive an input data corresponding to a movement of a user's finger on the touch screen of the mobile phone; and
a processor, wherein the processor is configured to execute a plurality of program modules stored in a memory, the plurality of program modules comprising:
an invoking module, configured to invoke a hooked preview program corresponding to a functional instruction after the functional instruction is inputted into a Computer Aided Design system;
a selecting module, configured to select a first pickup point in a drawing based on the input data;
a filtering module, configured to filter an entity in a predetermined range around the first pickup point to obtain a preselected entity;
a displaying module, configured to:
obtain a predetermined zooming-in factor;
perform calculation according to the predetermined zooming-in factor and pixels of the touch screen to obtain a size of a zoomed-in display area;
create the zoomed-in display area at a predetermined position of the touch screen according to the first pickup point and the size of the touch screen, wherein the zoomed-in area is not shielded by the finger;
display, in the zoomed-in display area, the preselected entity or the preselected entity processed by the hooked preview program;
a processing module, configured to process the preselected entity via the hooked preview program to display a preview of a result of processing the preselected entity by the functional instruction;
a first determining module, configured to, after displaying a preview of the result of processing the preselected entity, receive a user selection associated with the result of processing the preselected entity;
a returning module, configured to return, in response to the user selection indicating to select the result of processing the preselected entity, the entity information of the preselected entity to a control instruction to which the preview program is hooked, to enable the control instruction to process the preselected entity; and
a recovering module, configured to recover, in response to the user selection indicating not to select the result of processing the preselected entity, the preselected entity to a state before the preselected entity has been processed by the preview program by recovering and storing the state before the preselected entity has been processed by the preview program.

* * * * *